United States Patent [19]
Hoke et al.

[11] Patent Number: 5,077,875
[45] Date of Patent: Jan. 7, 1992

[54] REACTOR VESSEL FOR THE GROWTH OF HETEROJUNCTION DEVICES

[75] Inventors: William E. Hoke, Wayland, Mass.; Noren Pan, Nashua, N.H.; James R. Carter, North Grafton, Mass.

[73] Assignee: Raytheon Company, Lexington, Mass.

[21] Appl. No.: 668,707

[22] Filed: Mar. 12, 1991

Related U.S. Application Data

[63] Continuation of Ser. No. 473,256, Jan. 31, 1990, abandoned.

[51] Int. Cl.$^5$ .................................... H01L 21/205
[52] U.S. Cl. .................... 29/25.01; 118/715; 118/720; 118/725; 118/730; 156/610
[58] Field of Search ............... 118/715, 720, 725, 730; 156/610; 29/25.01

[56] References Cited

U.S. PATENT DOCUMENTS

| | | | |
|---|---|---|---|
| 4,568,397 | 2/1986 | Hoke et al. | 156/610 |
| 4,798,165 | 1/1989 | DeBoer | 118/715 |
| 4,828,224 | 5/1989 | Crabb et al. | 118/715 |
| 4,846,102 | 7/1989 | Ozias | 118/715 |
| 4,907,534 | 3/1990 | Huang et al. | 118/715 |

FOREIGN PATENT DOCUMENTS

| | | | |
|---|---|---|---|
| 0303508 | 8/1987 | European Pat. Off. | |
| 0104118 | 12/1982 | Japan | |
| 0112614 | 6/1984 | Japan | 118/725 |
| 3116735 | 10/1986 | Japan | |
| 1147056 | 11/1987 | Japan | |
| 0134913 | 5/1989 | Japan | |

OTHER PUBLICATIONS

Goodings et al., "A New Inlet Area Design for Horizontal MOVPE Reactors", Journal of Crystal Growth, 96, (1989), pp. 13-18.
Ehlers, H. et al., "Scanning Photoluminescence Study of the Spatial Uniformity of the Growth Rates of OMVPE Grown GaAs Quantum Wells", Journal of Crystal Growth, 96, (1989), pp. 101-106.
Woelk, E. et al., "A Novel MOVPE Reactor with a Rotating Substrate", Journal of Crystal Growth, 93, (1988), pp. 216-219.
Frijlink, P. M., "A New Versatile, Large Size MOVPE Reactor", Journal of Crystal Growth, 93, (1988), pp. 207-215.
Frijlink, P. M. et al., "Layer Uniformity in a Multiwafer MOVPE Reactor for III-V Compounds", Invited Paper for the Fifth MOVPE Conf. in Aachen, Germany, Jun. 1990.
Okamoto, A. et al., "Uniform Epitaxial Growth of Modulation-Doped $GaAs/Ga_{0.7}Al_{0.3}As$ on Three-Inch Substrate by Metalorganic Chemical Vapor Deposition", Japanese Journal of Applied Physics, vol. 25, No. 2, Feb. 1986, pp. 238-241.
Palmateer, S. et al., "New OMVPE Reactor for Large Area Uniform Deposition of InP and Related Alloys", Journal of Electronic Materials, vol. 18, No. 5, (1989), pp. 645-649.
Puetz, N. et al., "The Inverted Horizontal Reactor: Growth of Uniform InP and GaInAs by LPMOCVD", Journal of Electronic Materials, vol. 17, No. 5, (1988), pp. 381-386.

(List continued on text page.)

*Primary Examiner*—Olik Chaudhuri
*Assistant Examiner*—Ken Horton
*Attorney, Agent, or Firm*—Denis G. Maloney; Richard M. Sharkansky

[57] ABSTRACT

A metalorganic chemical vapor deposition (MOCVD) reactor vessel is provided for the growth of Group II-VI, Group III-V, or Group IV layers particularly for use in thin heterostructure devices. The reactor vessel includes a chamber having a top surface substantially parallel to a semiconductor substrate disposed within the chamber and an inlet through which a vapor stream is directed. The chamber further includes a plate having a plurality of apertures disposed therethrough and a block disposed adjacent to the plate, to increase the uniformity and decrease the turbulence of the vapor stream.

15 Claims, 4 Drawing Sheets

OTHER PUBLICATIONS

Rosenberg, J. J. et al., "An $In_{0.15}Ga_{0.85}As/GaAs$ Pseudomorphic Single Quantum Well HEM T", IEEE Electron Device Letters, vol. EDL-6, No. 10, Oct. 1985, pp. 491-493.

Ohori, T. et al., "Uniform and Abrupt InGaP/GaAs Selectively Doped Heterostructures Grown by MOVPE for HEMT ICs", Journal of Crystal Growth, 93, (1988), pp. 905-910.

Thompson, A. G. et al., "Organometallic Vapor Phase Epitaxial Growth of GaAs-based Pseudomorphic Modulation-Doped Field-Effect Transistor Structures", Appl. Phys. Lett., 55(21), Nov. 20, 1989, pp. 2208-2210.

Masselink, W. T. et al., "Cryogenic Operation of Pseudomorphic AlGaAs/InGaAs Single-Quantum-Well MODFETs", Electronics Letters, Sep. 26th, 1985, vol. 21, #20, pp. 937-939.

REACTOR VESSEL FOR THE GROWTH OF HETEROJUNCTION DEVICES

This application is a continuation of application Ser. No. 473,256, filed Jan. 31, 1990, now abandoned.

BACKGROUND OF THE INVENTION

This invention relates generally to the growth of semiconductor materials, and more particularly to the growth of thin semiconductor layers for use in heterostructure devices.

As it is known in the art, a heterostructure device is one in which semiconductor layers comprised of different materials having different electrical properties are disposed over one another providing a heterojunction. Examples of such devices are heterojunction field effect transistors (FETs), heterojunction bipolar transistors (HBTs), and optoelectronic devices. Selectively doped heterostructure devices can have higher electron mobility characteristics than, devices formed without heterojunctions due to the physical separation of free carriers from the charge donating atoms.

As it is also known in the art, heterojunction field effect transistors have important digital and analog, particularly microwave, applications. An example of such a heterojunction FET is the high electron mobility transistor (HEMT) which provides inter alia higher noise immunity characteristics than conventional digital FETs. Examples of gallium arsenide (GaAs)/gallium aluminum arsenide (GaAlAs) HEMTs grown by the technique of metalorganic chemical vapor deposition (MOCVD) are mentioned in an article by Ohori et al. in the Journal of Crystal Growth, Volume 93, pps. 905-910, 1988 where the interface between an InGaP layer and a GaAs layer provides the heterojunction of the HEMT device. With the device reported in the previous article, the sheet carrier concentration of the high electron mobility active layer of these structures is limited to $1.0 \times 10^{12}$ carriers/cm$^2$. This relatively low carrier concentration is undesirable because it reduces the current capability of the device.

As it is further known in the art, high electron mobility transistors having a channel layer comprised of gallium indium arsenide (GaInAs) exhibit improved performance characteristics over GaAlAs/GaAs HEMTs, and other HEMTs as mentioned above. More specifically the GaInAs/GaAs device is considered a pseudomorphic device since the adjacent layers are mechanically strained due to differences in the lattice constant of such layers. Thus, the HEMT device provided with such layers may be referred to as a pseudomorphic HEMT, or PHEMT. As described by J. J. Rosenberg et al. in IEEE Electron Device Letters, Volume EDL-6, No. 10, pps. 491-493, 1985, and W. T. Masselink et al. in Electronics Letters, Volume 21, #20, pps. 937-939, 1985, a pseudomorphic structure in which a thin GaInAs layer provides the channel layer results in higher DC and microwave performance capabilities than conventional HEMTs. The presence of the GaInAs channel layer provides a device having increased electron mobility, higher saturated velocity in the GaInAs channel layer, and larger conduction band discontinuity between the doping layer and the channel layer. Such improvements permit higher frequency operation and higher power handling capability.

One technique known in the art for providing GaInAs PHEMTs is molecular beam epitaxy (MBE). Molecular beam epitaxy is a growth technique in which source materials are placed in a vacuum chamber. Under such high vacuum conditions, the source materials evaporate and deposit onto a suitable substrate. While typically providing excellent material uniformity and control of abruptness of interfaces between epitaxial layers, MBE inherently has a relatively low throughput due to low deposition rate and limited deposition surface area and also requires a relatively complex and expensive reactor system.

As it is also in the art, metalorganic chemical vapor deposition (MOCVD) is a depositing process by which vapors of an organic compound containing an element or substance to be deposited are directed into a reactor and thermally decomposed to liberate the element or substance to be deposited. Such decomposition thus provides non-volatile reaction products which are deposited on a suitable substrate. This process can be scaled up to provide large deposition surface areas and, with a moderate deposition rate, yields high throughput. MOCVD may be carried out either under atmospheric pressure conditions or at a reduced pressure. The technique of MOCVD is sometimes referred to as metalorganic vapor phase epitaxy (MOVPE).

Reduced pressure MOCVD growth typically yields better material uniformity than such growth at atmospheric pressure. However, under such reduced pressure conditions, certain materials, in particular those having a relatively high vapor pressure at the growth temperature, will have increased evaporation of the elements to be deposited from the surface of the substrate. Such increased evaporation may inhibit film deposition or result in poor compositional uniformity. Also, reduced pressure MOCVD growth requires relatively complex apparatus in order to provide lower than atmospheric pressure conditions. This apparatus complexity will increase the overall process cost.

One approach suggested for providing GaInAs/InP PIN diodes by MOCVD uses an inverted growth cell and is described by N. Puetz et al. in the Journal of Electronic Materials, Volume 17, No. 5, pps. 381-386, 1988. There is no indication that the material provided by the authors would be suitable for PHEMT devices. Moreover, use of an inverted reactor complicates substrate handling and reactor manufacture and would be undesirable in a production environment.

The technique of MOCVD has been used to provide GaAlAs/GaAs and InGaP/GaAs HEMT devices, GaInAs/InP PHEMT devices, as well as GaInAs/InP PIN diode devices as described in the above referenced articles. Heretofore, the technique of MOCVD has not been generally used in providing pseudomorphic PHEMT devices having a GaInAs channel layer, because of the relative difficulty in providing compositionally uniform GaInAs layers across large areas as well as in providing such layers with abrupt junctions.

Compositional uniformity of a GaInAs layer grown by MOCVD is generally difficult to provide over large surface areas because of the relatively unstable characteristics of organic compounds used to provide a source of indium, particularly trimethylindium. In particular, at high pressures (i.e. atmospheric) gas phase depletion of the indium metal-organic occurs, whereas at low pressures increased evaporation of indium from the surface of the substrate occurs. Each of these conditions will result in a non-uniform distribution of indium in the GaInAs layer.

Moreover, GaAs, GaAlAs, and GaInAs layers are conventionally grown at different temperatures to accommodate different rates of gas phase depletion of the precursor compounds and to optimize material layer quality. In particular, GaAs layers are grown at approximately 650° C., whereas layers containing indium are grown at lower temperatures and layers containing aluminum are grown at higher temperatures. While this permits fabrication of PHEMT devices, due to time constants involved in ramping to higher or lower temperatures, interdiffusion or alloying can occur between adjacent layers. Interdiffusion between adjacent layers is undesirable, particularly for the growth of thin film and ultra thin film heterostructure devices.

It would therefore be desirable to grow GaInAs PHEMTs, and other heterojunction devices having uniform material and thickness composition over relatively large area substrates for integrated circuit fabrication using the technique of MOCVD. Moreover, it would also be desirable to provide layers with abrupt heterojunctions. Such growth may be conducted at either atmospheric pressure or reduced pressure conditions. In general, MOCVD growth would offer the benefits of requiring less complex and less costly apparatus than the technique of MBE, and higher throughput. If the uniformity and transport properties of GaInAs PHEMTs previously obtained by using the technique of MBE can be provided by MOCVD, then these benefits would have been acquired with no detrimental effect on device characteristics.

SUMMARY OF THE INVENTION

In accordance with the present invention, an MOCVD reactor vessel includes a chamber having a top surface disposed substantially parallel to an upper surface of a semiconductor substrate disposed inside the chamber, and further includes an inlet through which an incoming vapor stream is directed. The reactor vessel further includes means for increasing the uniformity and decreasing the turbulence of the vapor stream including: a plate having disposed therethrough a plurality of apertures, and means, disposed adjacent to the plate, for decreasing the total volume of the chamber. The reactor vessel further includes means for supporting the semiconductor substrate within the chamber, for rotating the substrate, and for heating the substrate to a predetermined temperature. With such an arrangement, the reactor vessel permits relatively unstable source elements, such as trimethylindium, to decompose and deposit indium uniformly over relatively large semiconductor substrate areas. The plate and means for decreasing the total volume of the chamber in combination increase the laminar flow characteristic of the incoming vapor stream to permit such uniform deposition. For example, the reactor vessel is used to provide a uniform layer of gallium indium arsenide over a 3 inch gallium arsenide substrate in order to provide a pseudomorphic high electron mobility transistor (PHEMT) with device quality transport properties.

The apparatus described above yields GaInAs PHEMTs having electron mobility and sheet density characteristics comparable to devices that have been grown using the technique of MBE. By using the growth technique of MOCVD, higher throughput than that provided by the technique of MBE may be achieved. Moreover, MOCVD apparatus in general is less expensive and less complex than MBE apparatus. This provides additional advantages to using the technique of MOCVD.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
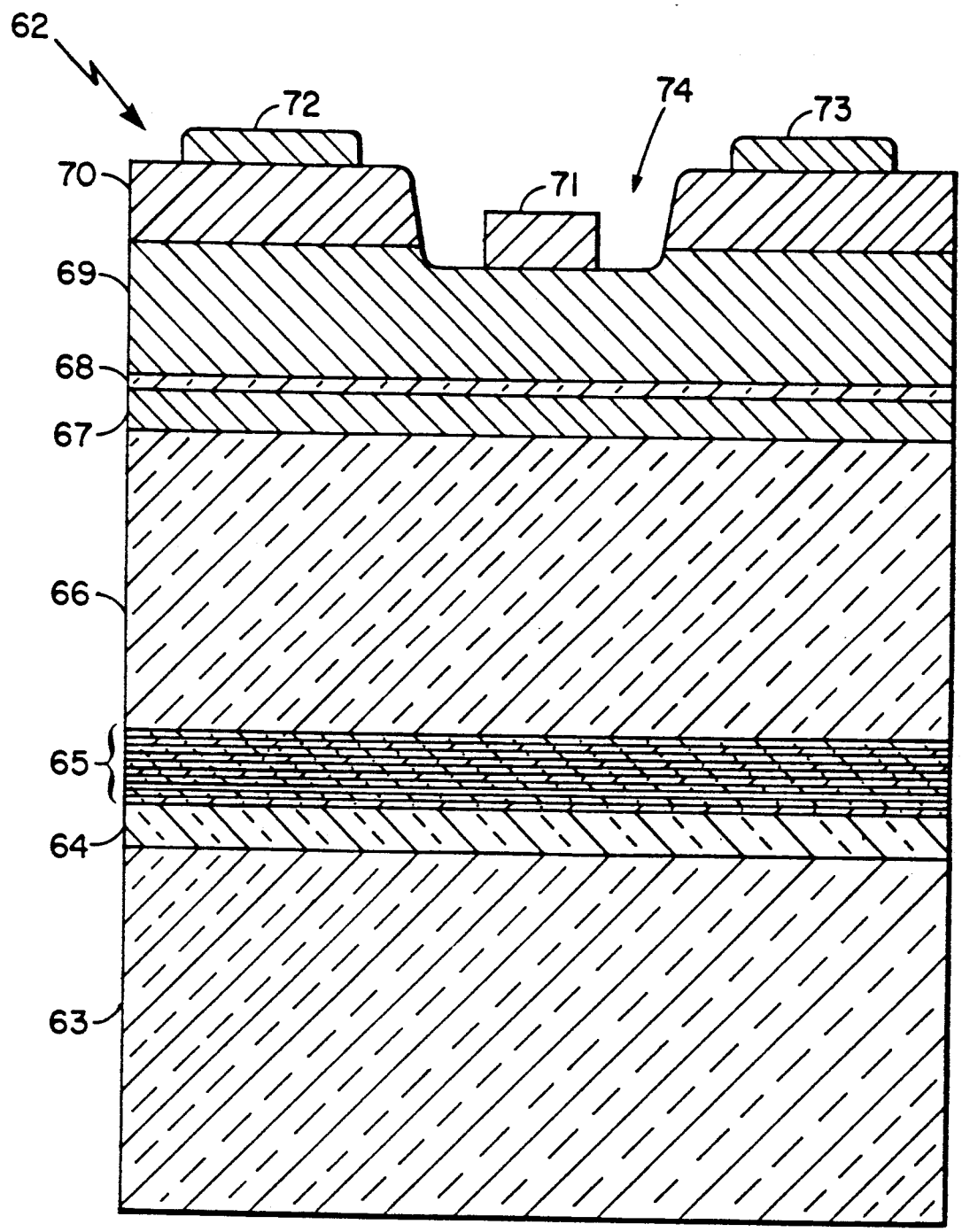
FIG. 1 is a cross-sectional view of a GaInAs pseudomorphic high electron mobility transistor including a GaInAs channel layer.

Referring now to FIG. 1 a pseudomorphic high electron mobility transistor (PHEMT) 62 is shown to include a GaInAs channel layer 67. The PHEMT 62 is shown to further include a semi-insulating substrate 63, here of gallium arsenide (GaAs). The substrate 63 could alternately be of any Group II-VI, Group III-V, or Group IV material such as cadmium telluride (CdTe), indium phosphide (InP), indium antimonide (InSb), or silicon (Si). The substrate 63 must be relatively thick in order to provide the device 62 with reasonable mechanical strength during fabrication. Here the substrate 63 is 0.025 inches thick. Disposed on the GaAs substrate 63 is a GaAs smoothing layer 64, here 1000 Å thick. The GaAs smoothing layer 64 has disposed thereover a superlattice structure 65 including ten individual layers, with each layer having a thickness of 50 Å, such layers alternatingly comprised of gallium aluminum arsenide (GaAlAs) and gallium arsenide (GaAs). Disposed over the superlattice structure 65 is a GaAs buffer layer 66. The superlattice 65 provides a barrier to impurities from the GaAs substrate 63 to reduce contamination of the buffer layer 66. Buffer layer 66 is 1 micron thick and is comprised of undoped high purity GaAs. Disposed over buffer layer 66 is the undoped GaInAs channel layer 67, here 100 Å thick having a 15 percent indium arsenide concentration ($Ga_{0.85}In_{0.15}As$), used to provide the PHEMT structure 62 with desirable charge transport properties and increased carrier concentration. An undoped spacer layer 68 of GaAlAs, here with a 60 Å thickness and a composition given by $Ga_{0.77}Al_{0.23}As$, is disposed over GaInAs channel layer 67. The thickness of layer 68 is chosen in order to maximize sheet carrier concentration of the device 62 while providing reasonable mobility to the device 62. The specific composition of layer 68 is chosen to maximize conduction band discontinuity while maintaining acceptable transport properties. An N-type layer 69, here 400 Å thick and comprised of GaAlAs doped with silicon to a concentration of $1.2 \times 10^{18}$ $cm^{-3}$, is disposed over the spacer layer 68. Disposed over layer 69 is an N+type, silicon doped GaAs contact layer 70 having a thickness of 300 Å, which provides ohmic contact for source electrode 72 and drain electrode 73 of the device 62. Such source and drain electrodes 72 and 73, here comprised of nickel and germanium doped gold, are disposed in ohmic contact with the contact layer 70 of the PHEMT device 62. Typically layer 70 has a dopant concentration of greater than $10^{18}$ $carrier/cm^3$. A gate electrode 71 is disposed in a chemically etched recessed portion 74 of layer 69 between source electrode 72 and drain electrode 73, as shown. The gate electrode 71, here comprised of titanium, platinum, and gold, is disposed in Schottky barrier contact with the doped GaAlAs layer 69 of the PHEMT 62.

Figure 2:
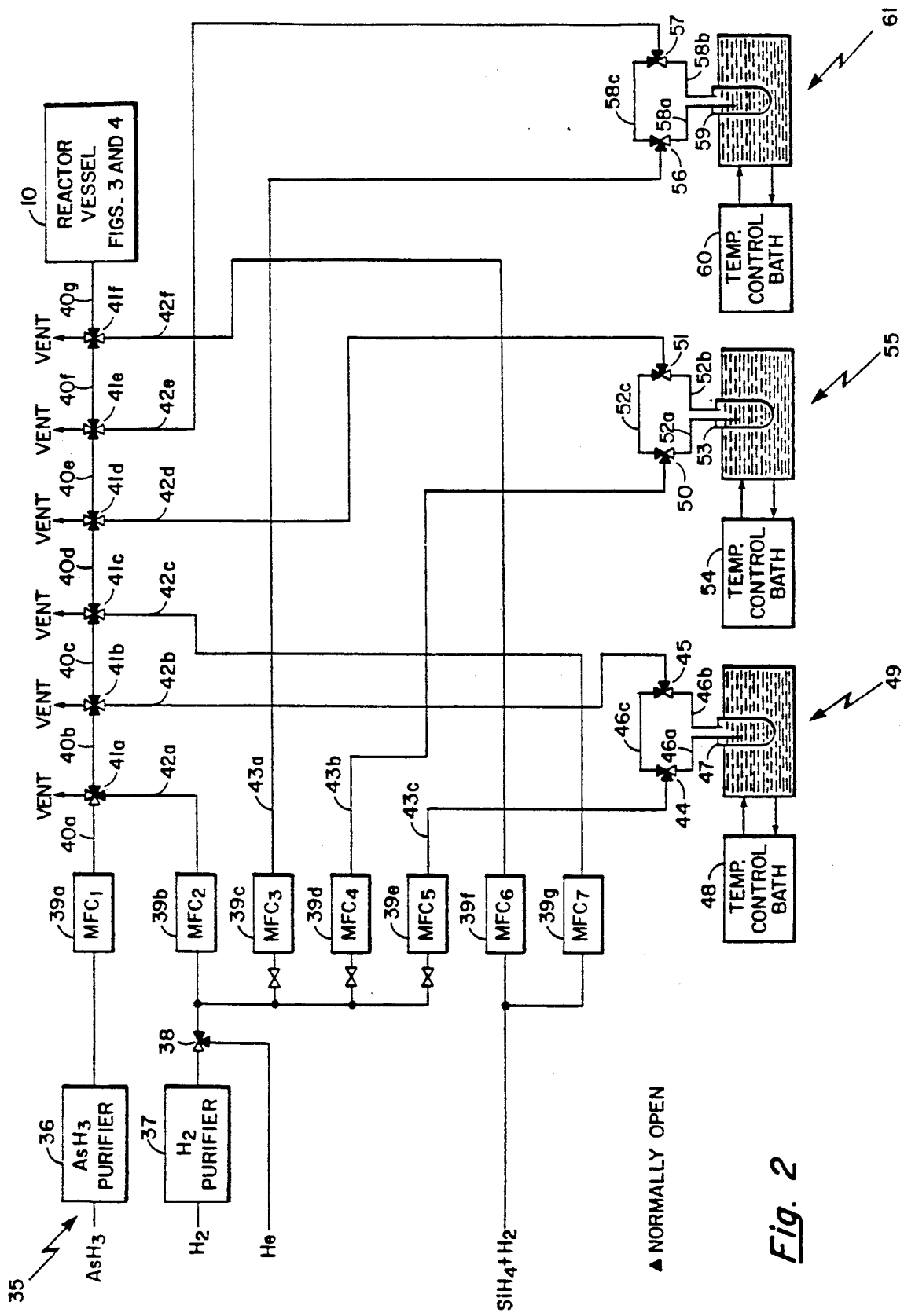
FIG. 2 is a schematic diagram of vapor apparatus used in conjunction with an MOCVD reactor vessel.

Referring now to FIG. 2, a schematic representation of the vapor apparatus 35 used for feeding source gases into an MOCVD reactor vessel 10 (FIGS. 3 and 4), is shown. Vapor apparatus 35 and MOCVD reactor vessel 10 (FIGS. 3 and 4) are used to grow epitaxial layers 64 to 70 of the PHEMT 62 as described in conjunction with FIG. 1. The apparatus 35 includes: mass flow controllers 39a-39g, bubbler apparatus 49, 55, and 61, four way solenoid control valves 41a-41f, and tube portions 40a-40g, 42a-42f, and 43a-43c. Such apparatus 35 allows source materials required for the growth of the PHEMT structure 62 of FIG. 1 to be supplied, in specific concentrations, to an MOCVD reactor vessel 10 (FIGS. 3 and 4) via tube portion 40g as will now be described.

A first mass flow controller 39a is fed by an arsine (AsH$_3$) supply after the arsine vapor has been directed through a purifier 36. The second through the fifth mass flow controllers 39b-39e are fed by either hydrogen or helium vapor depending on the activation of three-way solenoid control value 38. During epitaxial layer growth, mass flow controllers 39b-39e are fed by the hydrogen supply via hydrogen purifier 37. After growth and prior to unloading a device from MOCVD reactor vessel 10 (FIGS. 3 and 4), at which time the reactor vessel 10 and vapor apparatus 35 will be exposed to air, helium is introduced via vapor apparatus 35 to the reactor vessel 10. Helium gas enters the MOCVD reactor vessel 10 after passing through mass flow controller 39b, tube portion 42a, solenoid control valve 41a, and along the serially connected tube portions 40b-40g. Helium, an inert gas, is introduced into the reactor vessel 10 in order to purge the vessel 10 of hydrogen, thereby avoiding the potentially explosive combination of hydrogen and oxygen.

Vapors of various compounds are combined in serially connected tube portions 40a to 40g which are interconnected by solenoid control valves 41a to 41f, each one of such valves having four ports. Two ports of control valves 41a to 41f are input ports, and the other two are output ports. A first one of each of the input ports (not labelled) of the control valves 41b-41f is disposed in serial connection with a first one of the output ports (not labelled) of the serially preceeding control valves 41a to 41e via tube portions 40b-40f. For example, a first input port of control valve 41b is serially connected to a first output port of control valve 41a via tube portion 40b. The first solenoid control valve 41a is arranged such that a first input port of control valve 41a is fed by mass flow controller 39a, here containing arsine vapor, via tube portion 40a. A first one of the output ports of control valve 41f directly feeds the MOCVD reactor vessel 10 (FIGS. 3 and 4) via tube portion 40g. During normal MOCVD growth operation, the aforementioned input and output ports of solenoid control valves 41b to 41f are open. The serial connection of control valves 41a to 41f offers the flexibility of adding additional sources to the apparatus 35 with minimal difficulty.

A second output port of each of the four port solenoid control valves 41a to 41f is used to vent vapors. Prior to introducing vapors of any of the source materials into the reactor vessel 10 (FIGS. 3 and 4), such vapors are directed through the vent for a short predetermined period of time in order to saturate the vapor apparatus tubes thus providing a uniform flow of the gas into the reactor vessel 10 once the proper control valves are activated.

Second input ports of control valves 41a to 41f are fed by tube portions 42a to 42f. Such input ports are opened or closed according to the vapor content requirements of each stage of the chemical vapor deposition process. Tube portions 42b, 42d, and 42e supply second input ports of solenoid control valves 41b, 41d, and 41e respectively, and are fed by bubbler apparatus 49, 55, and 61 respectively.

Each bubbler apparatus 49, 55, and 61 includes a pair of solenoid control valves 44 and 45, 50 and 51, and 56 and 57, respectively. A first one of the solenoid control valves, here solenoid control valve 44 of bubbler apparatus 49, has a first port coupled to mass flow controller 39e via tube portion 43c, and has a second port coupled to a bubbler 47 via tube portion 46a. Bubbler 47 here has trimethylaluminum (TMAl) liquid disposed therein. The bubbler 47 is provided in a recirculating temperature control bath 48 which provides a constant flow of a coolant liquid around the bubbler 47 in order to maintain the trimethylaluminum contained in the bubbler 47 at a predetermined temperature, here 18.1° C. A second tube portion 46b is disposed in bubbler 47 above the TMAl liquid and is coupled to a port of solenoid control valve 45. A third tube portion 46c is coupled between remaining ports of solenoid control valves 44 and 45.

Figure 3:
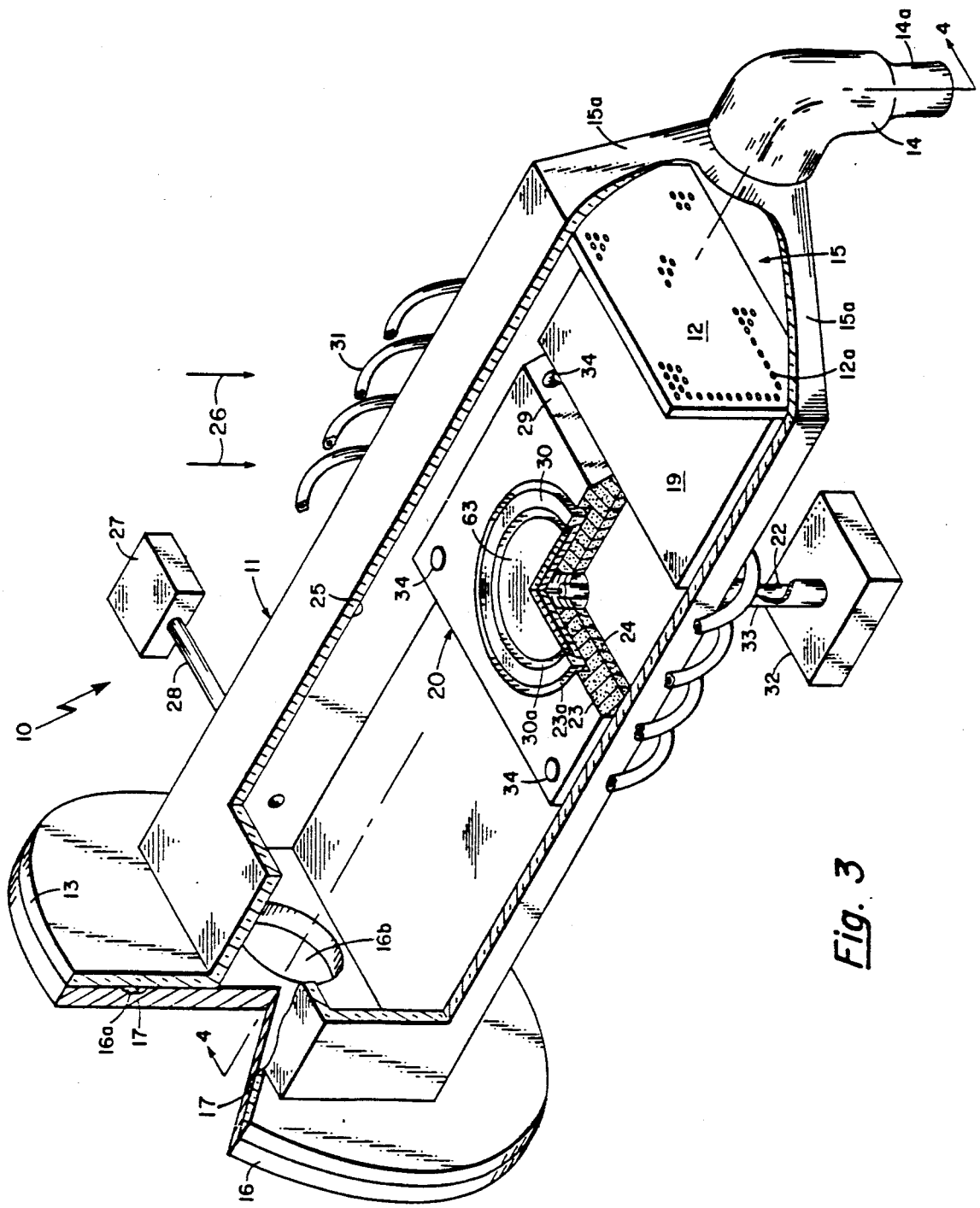
FIG. 3 is an isometric view of an MOCVD reactor vessel.
Figure 4:
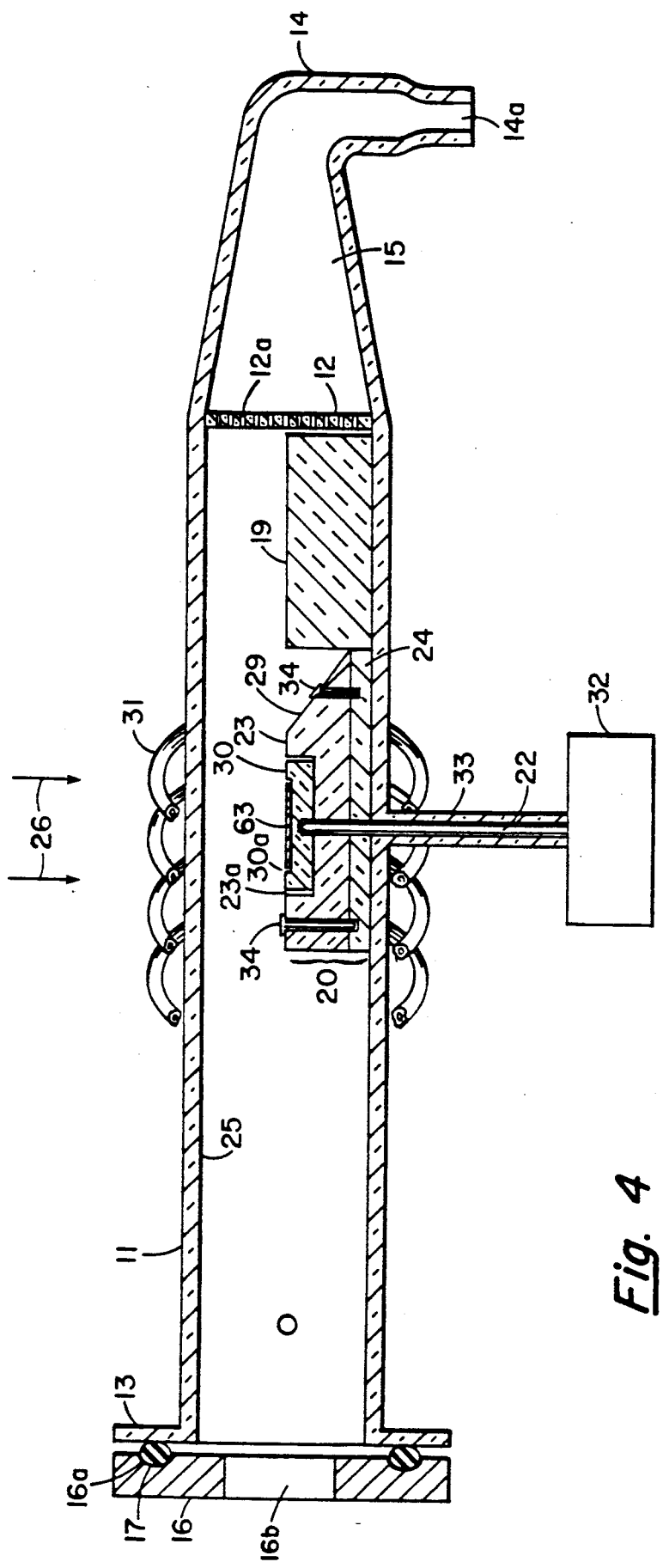
FIG. 4 is a cross-sectional view of the reactor vessel taken along line 4—4 of FIG. 3.

During epitaxial growth of the layers of the PHEMT devices of FIG. 1 which contain aluminum, control valves 44 and 45 are placed in their activated state enabling hydrogen gas to pass from the hydrogen supply, through hydrogen purifier 37, control valve 38, mass flow controller 39e, tube portion 43c, control valve 44, through tube portion 46a into bubbler 47 which contains the trimethylaluminum liquid. The hydrogen gas bubbles through the trimethylaluminum liquid and picks up molecules of TMAl. Therefore trimethylaluminum vapor and hydrogen gas emerge from bubbler apparatus 49 tube portion 46b and are routed via solenoid control valve 45 through tube portion 42b, solenoid control valve 41b, and along the serial path of tube portions 40c-40g and control valves 41c-41f to the MOCVD reactor vessel 10 (FIGS. 3 and 4).

In an arrangement similar to that described above, bubbler apparatus 55 includes solenoid control valves 50 and 51. Solenoid control valve 50 has a first port coupled to a mass flow controller 39d via tube portion 43b, and has a second port coupled to a bubbler 53 via tube portion 52a. Bubbler 53 here has disposed therein trimethylgallium (TMGa) liquid. The bubbler 53 is provided in a recirculating temperature control bath 54 which maintains the trimethylgallium at a predetermined temperature, here −10° C. A second tube portion 52b is disposed in the bubbler 53 above the TMGa liquid and is coupled to a port of control valve 51, and a third tube portion 52c is coupled between remaining ports of solenoid control valves 50 and 51. During epitaxial growth of layers comprised of gallium, control valves 50 and 51 are in their activated state enabling trimethylgallium and hydrogen vapor to enter MOCVD reactor vessel 10 via tube portions 42d, 40e-40g and control valves 41d-41f.

Similarly, control valve 41e is fed via tube portion 42e by bubbler apparatus 61. Such bubbler apparatus 61 includes solenoid control valves 56 and 57. Solenoid control valve 56 has a first port coupled to mass flow controller 39c via tube portion 43a, and has a second port coupled to a bubbler 59 via tube portion 58a. The bubbler 59 has trimethylindium (TMIn) disposed therein. The bubbler 59 is provided in a recirculating temperature control bath 60 which maintains the trimethylindium (TMIn) at a predetermined temperature of here 20.3° C. A second tube portion 58b is disposed in the bubbler 59, above the TMIn, and is coupled to a port of control valve 57. A third tube portion 58c is coupled between remaining ports of control valves 56 and 57. During epitaxial growth of layer 67 of the PHEMT device of FIG. 1, control valves 56 and 57 are in their activated state enabling trimethylindium and hydrogen vapor to enter the reactor vessel 10 via tube portions 42e, 40f, 40g, and control valves 41e and 41f.

Input ports of solenoid control valves 41c and 41f fed by mass flow controllers 39g and 39f, via tube portions 42c and 42f, respectively. Each of mass flow controllers 39f and 39g is fed by a silane (SiH$_4$) and hydrogen supply, here 50 parts per million (ppm) of silane diluted in hydrogen. Mass flow controller 39f provides silane and hydrogen vapor at a relatively high flow rate, between 0 and 100 standard cubic centimeters per minute (sccm), and controller 39g provides silane and hydrogen vapor at a relatively low flow rate, between 0 and 2 sccm. Silane is used as a source of silicon for the doping of layers 69 and 70 of the PHEMT device 62 as described in conjunction with FIG. 1.

Referring now to FIGS. 3 and 4, a reactor vessel 10 is shown to include a growth chamber 11, here of quartz. The growth chamber 11 has an inner top surface 25 disposed substantially parallel to a semiconductor substrate 63 disposed inside the growth chamber 11. Here the growth chamber 11 is rectangular shaped as shown. There are several advantages to using a growth chamber 11 having such a top surface 25 disposed substantially parallel to the substrate 63, rather than the more conventional cylindrical shaped chamber. In a rectangular chamber 11, the distance from the surface of the substrate 63 to the top surface 25 of the chamber 11 is uniform across the surface of the substrate 63. Since wall surfaces provide drag on gas flow, decreasing the uniformity of the velocity of such flow and potentially resulting in non-uniform deposition, the gas flow pattern in a rectangular chamber 11 will typically be more uniform than that in a cylindrical chamber. Also, an increase in the size of the substrate 63 will require less additional chamber volume with a rectangular chamber 11 since only the width of such a chamber would increase, whereas in a cylindrical chamber the overall diameter would increase.

The reactor vessel 10 further includes a plate or baffle 12 disposed adjacent to an inlet 14 of the reactor vessel 10. The inlet 14 includes a tubular portion 14a which terminates into a linearly tapered inlet area 15 with such area formed by tapered walls 15a of the reactor vessel 10 having termini at the end portion of the tubular portion 14a and the rectangular walls of chamber 11. Here the baffle 12 is comprised of quartz and is welded to the rectangular chamber 11 to terminate the inlet area 15. The baffle 12 is here used to diffuse an incoming vapor through inlet 14, to increase the laminar flow characteristic of said incoming vapor stream. The gas diffusing baffle 12 has a plurality of apertures or small holes 12a disposed therethrough. The holes 12a may be disposed in a pattern or random arrangement. Here the holes 12a are disposed in an ordered grid arrangement. During growth, vapor enters the reactor vessel 10 via the reactor inlet 14 (which is connected to tube portion 40g of vapor apparatus 35 of FIG. 2) at a high flow rate, approximately 10 liters/minute for example. At such flow rate, pressure builds up in the inlet area 15, behind the gas diffusing baffle 12, resulting in gas flow through all of the plurality of holes 12a of the gas diffusing baffle 12 thus providing a substantially laminar gas flow. As mentioned above, the inlet area 15 is linearly tapered; however, due to the diffusion of the gas by the baffle 12 once pressure has built up in the inlet area 15, the effect of the shape of such inlet area 15 on the uniformity of the resulting gas flow, is believed to be relatively insignificant. The gas diffusing baffle 12 and the inlet area 15 in which vapor pressure builds, prevent the gas from streamlining along the center of the rectangular chamber 11. Thus, to insure laminar flow by use of the baffle 12, it is believed to be sufficient to provide any shaped inlet area 15 between the inlet 14 and the baffle 12. Such area will prevent streamlining of the vapor through the baffle 12. Thus, the baffle 12 is disposed adjacent to but spaced from the inlet 14 of the reactor vessel 10. In applications where the width of the chamber 11 is increased due to an increase in the substrate 63 size, but the size of the inlet 14 remains the same, the streamlining effect will be more significant, emphasizing the importance of such a baffle 12.

Also shown in FIGS. 3 and 4, a block 19, here of quartz, is disposed adjacent to the quartz diffusing baffle 12 to decrease the total volume of the chamber 11. Excess volume reduces gas flow velocity and degrades uniformity by increasing turbulence. Also, increased by such excess volume is the switching response time of gases. Fast switching time is important in order to obtain abrupt chambers in the doping or composition of materials and is particularly critical in the growth of thin and ultra-thin film materials. Thus, by decreasing the volume of the chamber 11, the quartz block 19 increases the uniformity of the velocity of the gas flow, decreases the turbulence of such flow, and decreases the switching response time of gases, such that in combination with the aforementioned baffle 12, a substantially uniform, laminar flow of incoming gases is provided.

Disposed inside the rectangular growth chamber 11 is a susceptor 20 which supports semiconductor substrate 63. The susceptor 20 includes three individual parts; a body 23, a removable substrate platen 30, and an optimal spacer 24, here all of graphite.

The substrate platen 30 supports the semiconductor substrate 63 which is disposed in a circular recess 30a provided within the platen 30. The platen 30 is rotated by a rotating drive mechanism 32 and a drive shaft 22. Rotating drive mechanism 32 includes a variable speed motor and an O-ring belt drive connected to the drive shaft 22. A conventional liquid magnetic rotary bearing (not shown) is used to connect the drive shaft 22 to the rotating drive mechanism 32. The rectangular growth chamber 11 has a quartz shaft cover 33 which extends from an aperture in the bottom of the chamber 11 to the rotating drive mechanism 32. The drive shaft 22 is disposed inside the shaft cover 33. The drive shaft 22 is further disposed in contact with a groove 30b in the substrate platen 30 (FIG. 4) and the belt drive of rotating drive mechanism 32 such that when the motor is activated, the drive shaft 22, and thus the platen 30, rotate at speeds of up to 40 rpm. Here the speed of rotation is between 14 and 30 rpm. The platen 30 is disposed over a circular recess 23a provided within the body 23 of the susceptor 20. The platen 30 glides smoothly over the body 23 of the susceptor 20 since both surfaces are smooth graphite. An optional spacer 24 is shown disposed under the body 23 of the susceptor 20 and elevates the body 23 of the susceptor 20 and thus the platen 30 and the substrate 63. Here, the susceptor body 23 is elevated such that the top surfaces of the body 23, the substrate 63, and the block 19 are disposed in the same horizontal plane. Such a spacer 24 can be of various thickness and, by adjusting the distance from the surface of the substrate 63 to the top surface 25 of the chamber 11, allows the gas flow velocity over the surface of the substrate 63 to be adjusted. The optional spacer 24 and body 23 of the susceptor 20 are secured together via graphite pins 34 and may be integrally formed.

The body 23 of the susceptor 20 substantially fills the width of the rectangular chamber 11 and extends lengthwise beyond the substrate 63 as shown. The susceptor 20 is relatively large compared to the substrate 63 which it supports. By using such a relatively large susceptor 20, the excess volume of the chamber 11 is further decreased, thereby increasing the uniformity of the velocity of gas flow, decreasing the turbulence of such flow, and decreasing the switching response time of gases. Further, due to its relatively large thermal mass, susceptor 20 improves the temperature uniformity across the substrate 63.

The body 23 of the susceptor 20 has a slanted wall 29 adjacent the quartz block 19. This feature conventionally improves the laminar flow of gases. Here, however, the slanted wall 29 is used to decrease the occurrence of gas phase depletion of incoming gases over an alternative squared wall.

The substrate 63 is inductively heated by means of a copper coil 31, or an r.f. coil, which is disposed around the external periphery of the rectangular growth chamber 11. The copper coil 31 is wound around the chamber 11 and the shaft cover 33 such that it may be removed by rotating it around the chamber 11. The copper coil 31 is activated to heat the substrate 63 to a predetermined temperature, here the substrate 63 is heated to approximately 650° C. for the growth of all of the layers of the PHEMT device of FIG. 1. Other temperatures may alternatively be used. The temperature of the substrate 63 is monitored via a thermocouple (not shown) embedded within the susceptor 20. The copper coil 31 is disposed substantially over the substrate 63 and extends only slightly upstream (toward the inlet area 15) of the upstream edge of the substrate 63. In the deposition of compounds having low thermal stability, such as trimethylindium, it is important that the heating element, here the copper coil 31, not extend significantly upstream of the upstream edge of the substrate 63. Such an arrangement will keep the upstream edge of the susceptor 20 relatively cool, compared to a growth region over the substrate 63, thereby minimizing gas phase depletion of the incoming low thermal stability compound.

The top surface 25 of the rectangular growth chamber 11 is cooled, here by a fan (not shown) which is disposed above the reactor vessel 10, by air currents directed towards the reactor vessel 10 as shown by arrows 26. Other methods of cooling the top surface 25 of the chamber 11 could also be used. The cooling minimizes chemical deposition on the top surface 25 of the rectangular growth chamber 11 and consequent flaking of such deposits onto the substrate 63 during the growth process as well as minimizing gas phase depletion of the incoming gases.

The reactor vessel 10 further includes an end flange 13 welded to the end of the rectangular chamber 11 opposite inlet 14. End flange 13 is a circular shaped plate, here of quartz, having disposed therethrough a rectangular aperture with the same dimensions as the cross-section of the rectangular chamber 11. Such an opening provides a port through which materials are loaded and unloaded. The rectangular opening in the quartz end flange 13 has the same dimensions as the cross-section of the rectangular chamber 11 in order to minimize the open area of the chamber 11 during loading and unloading of materials and thus minimize the total amount of $H_2O$ or $O_2$ entering the chamber 11 as well as minimize the surface area at the end of the chamber 11 on which entering $H_2O$ and $O_2$ will deposit. Any $H_2O$ or $O_2$ entering the chamber 11 should be removed prior to initiation of growth.

During growth, an exhaust flange 16, here of stainless steel, is disposed against quartz end flange 13. Circular shaped exhaust flange 16 has a recessed groove 16a therein with a rubber O-ring gasket 17 disposed in such groove 16a. The flange 16 is coupled to the end flange 13 compressing the O-ring 17 in order to provide a leak tight seal for the rectangular growth chamber 11. The leaktight seal, provided by exhaust flange 16 when coupled to end flange 13 compresses O-ring gasket 17, and permits growth chamber 11 to be operated at a reduced pressure with fewer modifications. Exhaust flange 16 further has disposed therethrough a round aperture 16b having a diameter which reduces resistance of gas flow from the vessel. Tube portions (not shown) direct exhaust vapor from the reactor vessel 10, through the aperture to cracking furnaces where the vapor compounds are decomposed into more manageable waste.

The reactor vessel 10 further includes a safety feature, here an oil bubbler 27, connected to the chamber 11 via a tube portion 28. In the event that exhaust vapors are not able to flow out of the chamber 11 through the aperture in the exhaust flange 16, such vapors will be directed through tube portion 28 to oil bubbler 27 to vent. Oil in the oil bubbler 27 is maintained at a predetermined pressure such that when pressure within the chamber 11 exceeds the predetermined pressure in the bubbler 27, the exhaust vapors will exit the chamber 11 via tube portion 28.

In operation, the GaAs substrate 63 is placed in the circular recess 30a provided in platen 30 which in turn is disposed within a circular recess 23a in the body portion 23 of the susceptor 20 which is further disposed inside the quartz rectangular growth chamber 11. The reactor vessel 10 further has disposed therein a removable sleeve (not shown) which effectively covers the top surface 25 of the chamber 11 along a portion of the chamber 11 downstream of the susceptor 20. During growth, depositing will occur on the top surface 25 of the growth chamber 11. Such depositing, on the portion of the top surface 25 of the chamber 11 downstream of the susceptor 20, is undesirable since, as the substrate 63 is removed from the chamber 11, flaking of such deposits onto the substrate 63 may occur. Thus, prior to unloading the substrate 63 from the reactor vessel 10, the sleeve is removed from the chamber 11 to avoid potential contamination of the substrate 63. The removable sleeve also simplifies the maintenance of the reactor vessel 10 by keeping a portion of the top surface 25 of chamber 11 free of deposits.

The substrate 63 is inductively heated by the copper coil 31 to predetermined temperatures and maintained at the elevated temperatures for a predetermined length of time in an atmosphere of hydrogen in order "bake" the substrate 63 to remove any H₂O and oxides from the surface of the substrate 63. Here, the GaAs substrate 63 is heated to 390° C. and baked for 1 hour to remove H₂O. After this initial "baking"period, arsine is introduced to the reactor vessel 10 and substrate 63 is heated to 700° C. for 15 minutes. After the "baking" process, the substrate 63 is allowed to cool to the desired growth temperature, here 650° C. When the substrate 63 has reached the desired growth temperature, serially connected control valves 41a–41f (FIG. 2) are activated enabling mixtures of source materials: TMAl, TMGa, TMIn, and the dopant silicon in the form of silane (SiH₄) to emerge from tube 40g and enter rectangular growth chamber 11 at various stages of the growth of, for example, the PHEMT structure 62 of FIG. 1.

A common growth temperature of 650° C. was used for growth of all of the epitaxial layers 64–70 of the PHEMT device 62 of FIG. 1. Conventionally, to provide device quality compositional uniformity by minimizing gas phase depletion, GaAs layers are grown at a temperature of approximately 650° C., layers containing indium are grown at approximately 550° C., and those containing aluminum have a growth temperature of approximately 700° C. However, the reactor design described herein has several features which minimizes the occurrence of gas phase depletion of incoming vapors, and thus permit the growth of device quality GaAs, GaAlAs, and GaInAs layers at a common growth temperature. Using such a common growth temperature allows for the continuous sequential growth of layers 64–70 of the PHEMT device 62 (FIG. 1). That is, the layers may be deposited without interruption of the growth process. Further, such uninterrupted growth may permit fast switching of the gases, thus enhancing the abruptness of interfaces between layers.

The above described apparatus has been used to grow device quality gallium arsenide, gallium aluminum arsenide, and gallium indium arsenide epitaxial layers. Gallium indium arsenide epitaxial film growth was developed for such applications as psueodomorphic high electron mobility transistors (PHEMTs) as described in conjunction with FIG. 1.

The specific flow rates of arsine and the carrier gas hydrogen, including the rate of hydrogen flow through each of the bubblers 47, 53, and 59, for the growth of layers 64–70 of the PHEMT device 62 of FIG. 1, is shown below in Table 1. Also shown is the overall growth rate of GaAs, GaAlAs, and GaInAs layers.

TABLE 1

|  | GaAs | GaAlAs | GaInAs |
|---|---|---|---|
| Total H₂ flow rate | 9.0 l/min | 9.0 l/min | 10.0 l/min |
| Arsine flow rate | 10.9 cc/min | 34.9 cc/min | 25.1 cc/min |
| H₂ through TMG bubbler | 23.1 cc/min | 10.2 cc/min | 10.2 cc/min |
| H₂ through TMA bubbler | — | 4.1 cc/min | — |
| H₂ through TMI bubbler | — | — | 50.5 cc/min |
| Growth rate | 5.83 Å/sec | 3.82 Å/sec | 3.14 Å/sec |

The preferred growth conditions to provide the gallium indium arsenide layer are:
Semi-insulating substrate GaAs 2° off (100) plane towards nearest <110> axis
Substrate temperature = 650° C.
Total hydrogen flow = 10.0 l/min
Trimethylindium mole fraction = $1.27 \times 10^{-5}$
Trimethylgallium mole fraction = $5.75 \times 10^{-5}$
Growth rate = 3.14 Å/sec The electrical properties obtained from five samples of gallium indium arsenide PHEMT devices (FIG. 1) are shown in Table 2.

TABLE 2

| No. | Mobility at 77° K. (cm²/V − s) | Mobility at 300° K. (cm²/V − s) | Carrier Concentration at 77° K. (cm⁻²) | Carrier Concentration at 300° K. (cm⁻²) |
|---|---|---|---|---|
| 1 | 46,300 | 7,407 | $1.35 \times 10^{12}$ | $1.28 \times 10^{12}$ |
| 2 | 48,200 | 6,776 | $1.24 \times 10^{12}$ | $1.47 \times 10^{12}$ |
| 3 | 52,000 | 7,246 | $1.25 \times 10^{12}$ | $1.41 \times 10^{12}$ |
| 4 | 60,200 | 7,283 | $1.06 \times 10^{12}$ | $1.27 \times 10^{12}$ |
| 5 | 62,000 | 6,803 | $1.09 \times 10^{12}$ | $1.41 \times 10^{12}$ |

In addition to the device quality carrier concentration and mobility results of Table 2, the GaInAs/GaAs PHEMT devices grown in accordance with the present invention exhibit excellent uniformity of electrical properties on a single substrate as shown in Table 3. Measurements A–E were taken at different locations on a single substrate, with measurement C taken in the center of the round substrate, and measurements A, B, D, and E taken at equally spaced locations at the edge of the substrate.

TABLE 3

| Location | Mobility at 77° K. (cm²/V − s) | Mobility at 300° K. (cm²/V − s) | Carrier Concentration at 77° K. (cm⁻²) |
|---|---|---|---|
| A | 50,046 | 6,996 | $1.22 \times 10^{12}$ |
| B | 50,378 | 7,153 | $1.16 \times 10^{12}$ |
| C | 49,857 | 7,081 | $1.22 \times 10^{12}$ |
| D | 48,427 | 7,247 | $1.23 \times 10^{12}$ |
| E | 49,486 | 7,028 | $1.17 \times 10^{12}$ |

Having described preferred embodiments of the invention, it will now become apparent to one of skill in the art that other embodiments incorporating their concepts may be used. For example, devices such as heteroinjunction bipolar transistors (HBTs) and optoelectronic devices as well as other materials such as mercury cadmium telluride may be provided in accordance with the present invention. Also, the MOCVD apparatus as described herein may be modified to operate under reduced pressure conditions. It is felt, therefore, that these embodiments should not be limited to disclosed embodiments, but rather should be limited only by the spirit and scope of the appended claims.

What is claimed is:
1. A reactor vessel comprising:
(a) a chamber having a top surface disposed substantially parallel to a semiconductor substrate disposed within the chamber, said chamber having an inlet through which a vapor stream is directed:
(b) means for increasing the uniformity and decreasing the turbulence of the vapor stream comprising: a plate disposed within the chamber and substantially perpendicular to said semiconductor substrate, said plate having disposed therethrough a plurality of apertures; and

(c) means for supporting the semiconductor substrate, for rotating the substrate, and for heating the substrate to a predetermined temperature.

2. The reactor vessel recited in claim 1 wherein the means for increasing the uniformity and decreasing the turbulence of the vapor stream further comprises means for decreasing the total volume of the chamber.

3. The reactor vessel recited in claim 2 wherein the means for decreasing the total volume of the chamber is a block.

4. The reactor vessel recited in claim 1 wherein the chamber is rectangular shaped and has a substantially planar bottom surface, said bottom surface being disposed substantially parallel to the semiconductor substrate.

5. The reactor vessel recited in claim 1 further comprising an outlet having the same cross-sectional dimensions as the chamber.

6. The reactor vessel recited in claim 1 wherein the means for heating the substrate is further disposed substantially over the substrate.

7. The reactor vessel recited in claim 1 wherein the inlet and the plate are spaced by a chamber region.

8. The reactor vessel recited in claim 7 wherein said chamber region is linearly tapered.

9. The reactor vessel recited in claim 3 wherein a top surface of the block and a top surface of the substrate are disposed along the same horizontal plane.

10. The reactor vessel recited in claim 1 wherein the chamber is maintained at atmospheric pressure.

11. A reactor vessel comprising:
(a) a chamber having a top surface disposed substantially parallel to a semiconductor substrate disposed within the chamber and a bottom surface having an aperture disposed therethrough, said chamber having an inlet through which a vapor stream is directed;
(b) means for increasing the uniformity and decreasing the turbulence of the vapor stream comprising:
a plate disposed within the chamber and substantially perpendicular to said semiconductor substrate, said plate having disposed therethrough a plurality of apertures;
(c) a susceptor, disposed within said chamber, said susceptor having an aperture disposed therethrough and aligned with the aperture in the bottom surface of the chamber, said susceptor further having a top surface in which is disposed a recess;
(d) a rotatable shaft disposed vertically through the aperture in the bottom surface of the chamber and the aperture in the susceptor; and
(e) a platen, disposed within said recess, wherein said platen is in contact with said shaft.

12. The reactor vessel recited in claim 11 further comprising a chamber region disposed between the inlet and the plate.

13. The reactor vessel recited in claim 11 wherein the means for increasing the uniformity and decreasing the turbulence further includes a block for decreasing the total volume of the chamber.

14. The reactor vessel recited in claim 11 wherein said platen has a groove and wherein said groove is in contact with said shaft.

15. The reactor vessel recited in claim 11 wherein said platen has a top surface in which is disposed a recess and wherein said semiconductor substrate is disposed therein.

* * * * *